United States Patent
Chen et al.

(10) Patent No.: US 7,859,354 B1
(45) Date of Patent: Dec. 28, 2010

(54) RING OSCILLATORS

(75) Inventors: Shuxian Chen, Fremont, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 20 days.

(21) Appl. No.: 11/960,343

(22) Filed: Dec. 19, 2007

(51) Int. Cl.
*H03B 27/00* (2006.01)
*H03B 5/24* (2006.01)

(52) U.S. Cl. .................... 331/173; 331/55; 331/57
(58) Field of Classification Search ............ 331/55, 331/57, 173
See application file for complete search history.

(56) References Cited

U.S. PATENT DOCUMENTS

| | | | |
|---|---|---|---|
| 5,302,920 A | 4/1994 | Bitting | |
| 5,418,498 A | 5/1995 | DeVito et al. | |
| 5,815,043 A | 9/1998 | Chow et al. | |
| 6,028,488 A * | 2/2000 | Landman et al. | 331/1 A |
| 6,028,490 A | 2/2000 | Komatsu | |
| 6,621,359 B2 * | 9/2003 | Lee et al. | 331/57 |
| 6,711,084 B2 * | 3/2004 | Ishida et al. | 365/226 |

OTHER PUBLICATIONS

T. W. Houston "Comments on 'Higher Harmonic Generation in CMOS/SOS Ring Oscillators'", IEEE Transactions on Electron Devices, vol. 30, No. 8, Aug. 1983, pp. 958-959.

N. Sasaki "Higher Harmonic Generation in CMOS/SOS Ring Oscillators", IEEE Transactions on Electron Devices, vol. 29, No. 2, Feb. 1982, pp. 280-283.

* cited by examiner

*Primary Examiner*—Robert Pascal
*Assistant Examiner*—James E Goodley
(74) *Attorney, Agent, or Firm*—Treyz Law Group; G. Victor Treyz

(57) ABSTRACT

Ring oscillator circuitry is provided. The ring oscillator circuitry may include a loop of inverters. A control gate may be interposed in the loop to control operation of the loop. The control gate may be activated using a ring oscillator trigger signal. During application of the trigger signal, the trigger signal may become degraded due to circuit parasitics. Trigger signal conditioning circuitry may be used to remove noise from the degraded trigger signal. A version of the trigger signal that has been conditioned by the trigger signal conditioning circuitry may be applied to a control input of the control gate. The trigger signal conditioning circuitry may include a low pass filter, a hysteresis circuit, and a two-stage buffer. The two-stage buffer may be formed from transistors with the same characteristics as the transistors in the inverters of the ring oscillator loop.

20 Claims, 12 Drawing Sheets

RING OSCILLATORS

BACKGROUND

This invention relates to integrated circuits, and more particularly, to ring oscillator circuits on integrated circuits.

Ring oscillators are used in a variety of circuit applications. For example, circuit designers may use ring oscillator circuits to characterize transistor switching speeds. With this type of approach, a ring oscillator may be fabricated on an otherwise unused portion of an integrated circuit substrate such as in an area of a wafer normally reserved for scribe lines. During manufacturing, the performance of the ring oscillator may be measured. The switching speed of transistors on the integrated circuit can be computed based on the measured ring oscillator frequency. If the switching speed is too low or too high, corrective actions may be taken by modifying the fabrication process. Ring oscillators may also be used in clock circuits and delay-locked-loop-type circuits.

Ring oscillators are formed from a loop of inverters. There may be, for example, hundreds of inverters in a ring oscillator each of which has its output connected to the input of another one of the inverters. In some designs, a NAND gate may be inserted into the loop in place of one of the inverters. One of the NAND gate inputs may be used as an enable input. The ring oscillator may be enabled by asserting a trigger signal on the enable input. When the value of the trigger signal on the enable input is low, the ring oscillator will be turned off and will not oscillate. When the value of the trigger signal on the enable input is high, the ring oscillator will be enabled and will oscillate.

The trigger signals that are used for enabling and disabling ring oscillators in this way are generally produced using off-chip test equipment. As the trigger signals are routed to the enable input of the NAND gate through interconnects, the trigger signals can become degraded. In particular, a square wave trigger signal may pick up undesirable ringing characteristics due to parasitic circuit elements or due to power supply glitches. The spikes or other noise characteristics that are present in a trigger signal that has been degraded in this way may cause a ring oscillator to enter undesirable modes of operation in which higher-order harmonics propagate around the ring. When this happens, the operation of the ring oscillator may be unstable or the output of the ring oscillator may oscillate at an undesired higher-order harmonic frequency rather than at an intended fundamental frequency.

It would therefore be desirable to be able to provide improved integrated circuit ring oscillators.

SUMMARY

In accordance with the present invention, ring oscillator circuitry is provided. The ring oscillator circuitry may be provided on an integrated circuit. A number of inverters may be connected in a loop to form the ring oscillator. A control gate such as a NAND gate may be interposed in the loop of inverters. The control gate may have a control input. A trigger signal may be applied to the control input to enable and disable operation of the ring oscillator.

Trigger signals may be subject to noise. To prevent unwanted noise from disrupting normal operation of the ring oscillator, the ring oscillator circuitry may be provided with trigger signal conditioning circuitry. An otherwise degraded trigger signal may be conditioned by the trigger signal conditioning circuitry to remove voltage spikes and other unwanted noise components.

The trigger signal conditioning circuitry may include a low pass filter, a hysteresis circuit, and a two-stage buffer. The low pass filter may be formed from an inverter or resistor and a capacitor that has been connected between the output of the low pass filter and ground. The hysteresis circuit may have a feedback path. A transistor or inverter may be provided in the feedback path. The two-stage buffer may be formed from transistors that are fabricated to the same specifications as the transistors in the loop of inverters. For example, the gate lengths and widths of the two-stage buffer transistors may be the same as the gate lengths and widths of the transistors in the inverters of the ring oscillator loop.

Further features of the invention, its nature and various advantages will be more apparent from the accompanying drawings and the following detailed description.

DETAILED DESCRIPTION

Figure 1:
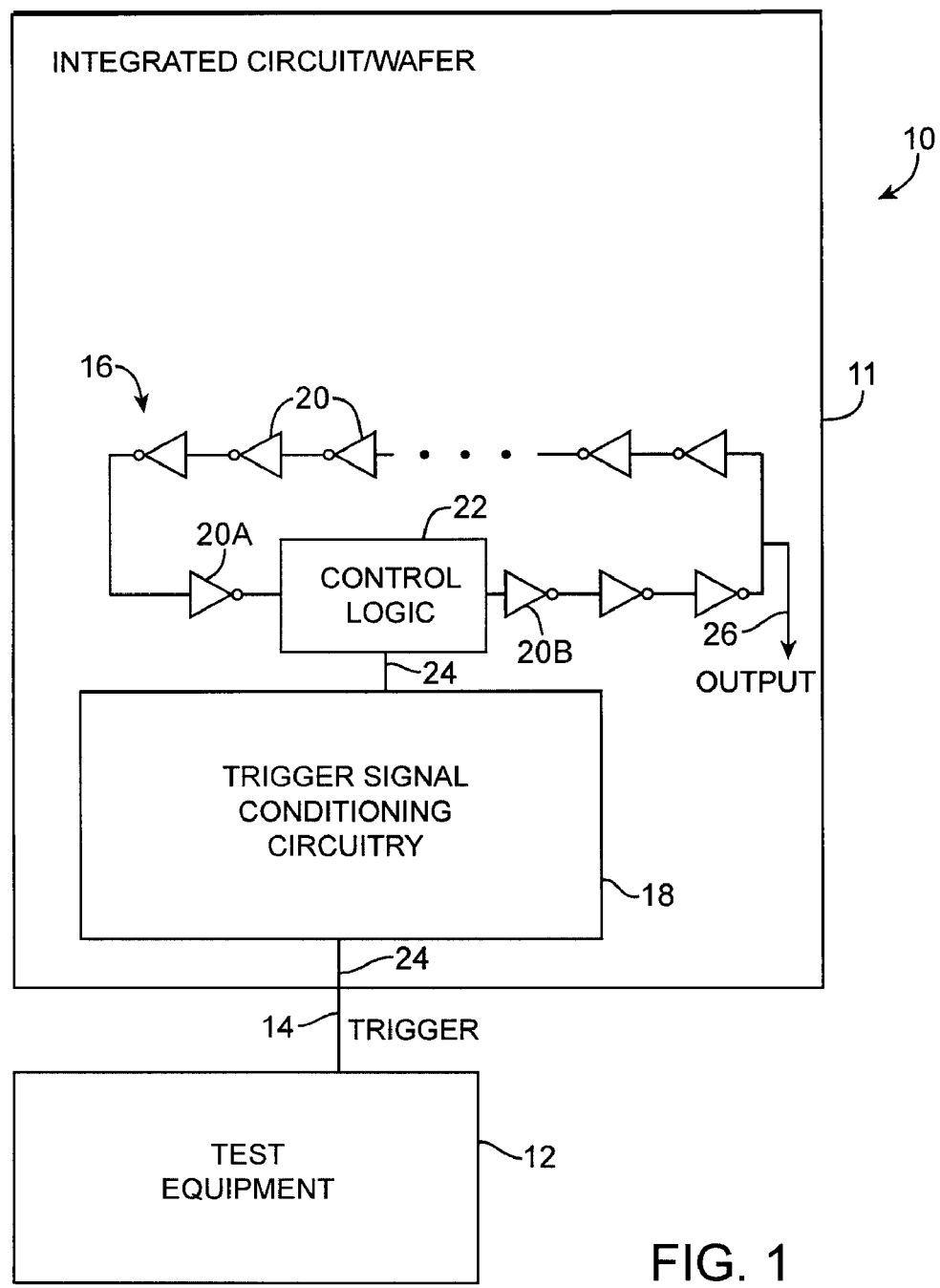
FIG. 1 is a diagram of an illustrative system environment in which an integrated circuit may be provided with ring oscillator circuitry in accordance with an embodiment of the present invention.

The present invention relates to ring oscillator circuitry. Ring oscillator circuitry may be provided on integrated circuits such as digital signal processors, programmable logic device integrated circuits, microprocessors, application specific integrated circuits, or other integrated circuits.

In some situations, ring oscillators are incorporated into a circuit design. For example, a ring oscillator may be used as part of a clock signal generator. As another example, a ring oscillator may be used in a delay-locked-loop-type circuit. These are merely illustrative examples. Ring oscillator circuits may be used in any suitable integrated circuit application.

In other situations, ring oscillators are used for circuit characterization. In a typical circuit characterization arrangement, ring oscillators are fabricated on a silicon wafer in portions of the wafer that lie between integrated circuit die (i.e., in portions of the wafer that may be normally reserved for scribe lines). The frequency at which the ring oscillators operate provide insight into transistor switching speed. In turn, transistor switching speed measurements may provide insight into semiconductor fabrication process variations. For example, if a ring oscillator exhibits a lower resonance frequency than anticipated, the fabrication process that was used to fabricate the wafer and the integrated circuit structures on the wafer may need to be adjusted accordingly.

A typical ring oscillator may be formed from a series of connected inverters. For example, hundreds of inverters may be connected in a ring so that the output of each inverter feeds into the input of a successive inverter in the ring.

To control operation of the ring oscillator, a two-input NAND gate may be inserted into the ring in place of one of the inverters. One input of the two-input NAND gate may receive the output of a preceding inverter. The other input of the two-input NAND gate may receive an enable signal. The enable signal may be generated by test equipment. In a typical scenario, the test equipment may generate a square-wave trigger signal. The square wave trigger signal may be routed to the input of the NAND gate to control the ring oscillator.

When the trigger signal is low at the NAND gate enable input, the output of the NAND gate will be held high, regardless of the state of the other NAND gate input. A low trigger signal value therefore may be used to disable the ring oscillator.

When the trigger signal is high at the NAND gate enable input, the NAND gate will serve as an inverter. High logic signals that are presented to the other input of the NAND gate will be inverted and corresponding low logic signals will be produced at the NAND gate output. Low logic signals will be inverted to produce high output signals.

To ensure that the ring oscillator operates properly, the trigger signal must be relatively noise free. If the trigger signal is degraded (e.g., due to parasitic circuit elements associated with the interconnects that are used to route the trigger signal to the NAND gate in the ring oscillator), the trigger signal may exhibit ringing.

Noise spikes or other undesirable signal characteristics that are associated with a degraded trigger signal can cause a ring oscillator to exhibit unstable performance. If care is not taken, a noisy trigger signal can cause a ring oscillator to oscillate at an undesirable higher-order harmonic frequency, rather than its intended fundamental frequency. This can cause a circuit that is based on the ring oscillator to operate improperly. Unintended operation of a ring oscillator at higher-order harmonic frequencies may also lead to erroneous characterization measurements in situations in which the ring oscillator's performance is being used to monitor a semiconductor fabrication process.

To avoid these problems, ring oscillator circuitry in accordance with an embodiment of the invention may be provided with trigger signal conditioning circuitry. The trigger signal conditioning circuitry can condition trigger signals before the trigger signals are used to control operation of a ring oscillator. The trigger signal conditioning circuitry helps to ensure proper operation of the ring oscillator.

An illustrative system 10 in which an integrated circuit has circuitry for conditioning ring oscillator trigger signals is shown in FIG. 1. As shown in FIG. 1, test equipment 12 may generate a trigger signal TRIGGER. Test equipment 12 may be based on any suitable test platform. In a typical arrangement, test equipment 12 may include hardware such as computers and function generators. Test equipment 12 may also include test software (e.g., software for implementing a test control program). If desired, test signals such as ring oscillator trigger signals may also be generated using on-chip circuitry.

System 10 may include a substrate 11 on which one or more ring oscillators such as ring oscillator 16 have been fabricated. Substrate 11 may include one or more integrated circuits. For example, substrate 11 may include an integrated circuit such as a programmable logic device integrated circuit, a microprocessor, a digital signal processor, an application specific integrated circuit, a memory device, or other suitable integrated circuit. Substrate 11 may be a semiconductor substrate such as a silicon wafer. One or more integrated circuits may be formed on substrate 11.

Ring oscillator 16 may be incorporated within the circuitry of an integrated circuit. For example, ring oscillator 16 may be formed as part of a clock generator, delay-locked-loop-type circuit, or other suitable circuitry. Ring oscillator 16 may also be fabricated as a stand-alone test circuit on substrate 11. With this type of arrangement, ring oscillator 16 may be fabricated between integrated circuit die locations (e.g., in the portion of a wafer that is normally reserved for scribe lines).

Ring oscillator 16 may have a loop of inverters 20. There may be any suitable number of inverters 20 in a given ring oscillator 16. For example, there may be tens of inverters 20, hundreds of inverters 20, or any other suitable number of inverters 20. During operation, ring oscillator 16 oscillates. The output of ring oscillator 16 may be tapped at one or more locations such as output 26. Signals from outputs such as output 26 may be monitored by test equipment 12 and/or may be used as inputs to other circuits (e.g., clock circuits, etc.).

In order to control the operation of ring oscillator 16, control logic 22 may be incorporated into the loop of inverters 20. Control logic 22 may be based on any suitable logic circuitry.

With one suitable arrangement, control logic 22 includes a two-input NAND gate. A first of the two inputs of the NAND gate receives an output signal from a preceding inverter 20 (i.e., inverter 20A in FIG. 1). A second of the two inputs of the NAND gate receives a signal from trigger signal conditioning circuitry 18. The output of the NAND gate may be provided to the input of a succeeding inverter 20 in the loop (i.e., inverter 20B in FIG. 1).

When the control signal on the second NAND gate input is low, the output of the NAND gate is held high, regardless of the state of the signal on the first NAND gate input. In this situation, the control signal disables ring oscillator 16. When the control signal on the second NAND gate input is high, the NAND gate functions as one of inverters 20. When operating in this way, the NAND gate provides signals at its output that are inverted versions of the signals provided on its first input.

The use of a NAND gate as control logic 22 is merely illustrative. Any suitable control logic circuitry may be used for logic 22 if desired. In general, control logic 22 has a signal input that receives the output of inverter 20A, a signal output connected to the input of inverter 20B, and a control input. The control input receives a control signal. The control signal (e.g., a trigger signal from test equipment 12) is used to enable or disable ring oscillator 16.

Figure 2:
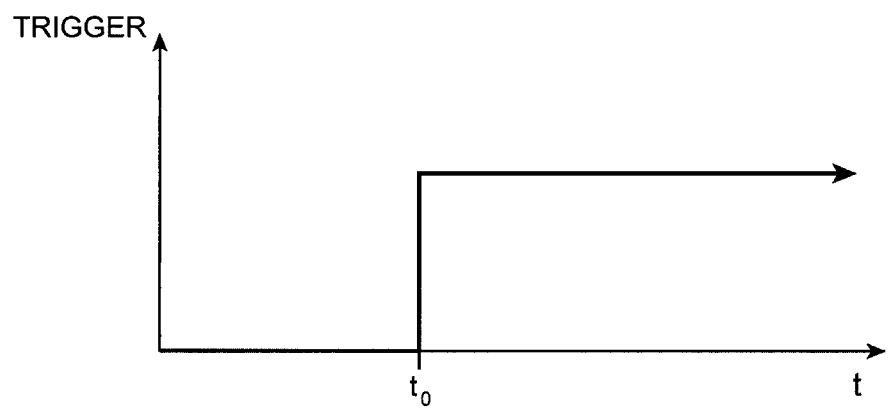
FIG. 2 is graph showing an illustrative trigger signal that may be used to enable an integrated circuit ring oscillator in accordance with an embodiment of the present invention.
Figure 3:
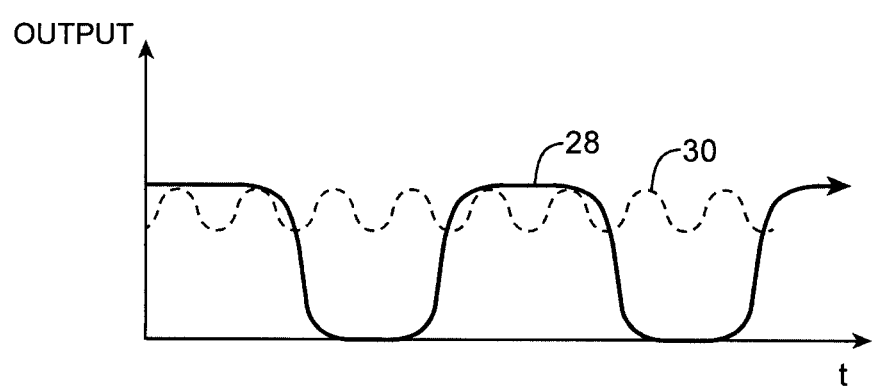
FIG. 3 is a graph of illustrative ring oscillator output signals that may be produced at the output of a ring oscillator including a desired fundamental oscillator frequency and an undesired higher-order oscillator frequency.

A trigger signal on test equipment output 14 may be conveyed to the control input of control logic 22 over path 24. Trigger signal conditioning circuitry 18 may be interposed in path 24. At the output of test equipment 12, trigger signal TRIGGER may be a relatively low noise square wave, as shown in FIG. 2. In the absence of trigger signal conditioning circuitry 18, the trigger signal may degrade (e.g., due to circuit parasitics in path 24), so that the version of the trigger signal at the input of control logic 22 contains voltage spikes or other noise. When operating properly in the absence of noise on the trigger signal at the input of control logic 22, ring oscillator 16 may oscillate at a fundamental frequency and may have an output signal at output 26 that is characterized by solid line 28 in FIG. 3.

However, when ring oscillator 16 is controlled using a degraded trigger signal that contains noise spikes, ring oscillator 16 may induce ring oscillator 16 to oscillate at an undesirable higher-order frequency, as illustrated by dashed line 30. Higher-order harmonics such as the higher-order harmonic of line 30 may coexist with fundamental frequency signal 28 or may replace fundamental frequency signal 28. The operation of the circuit in which ring oscillator 16 is operating and/or characterizing measurements that are being made using output from the ring oscillator may therefore be disrupted.

Trigger signal conditioning circuitry 18 may be used to ensure that the trigger signal that is applied to the control input of control logic 22 is relatively free from noise. This ensures proper operation of ring oscillator 16.

Figure 4:
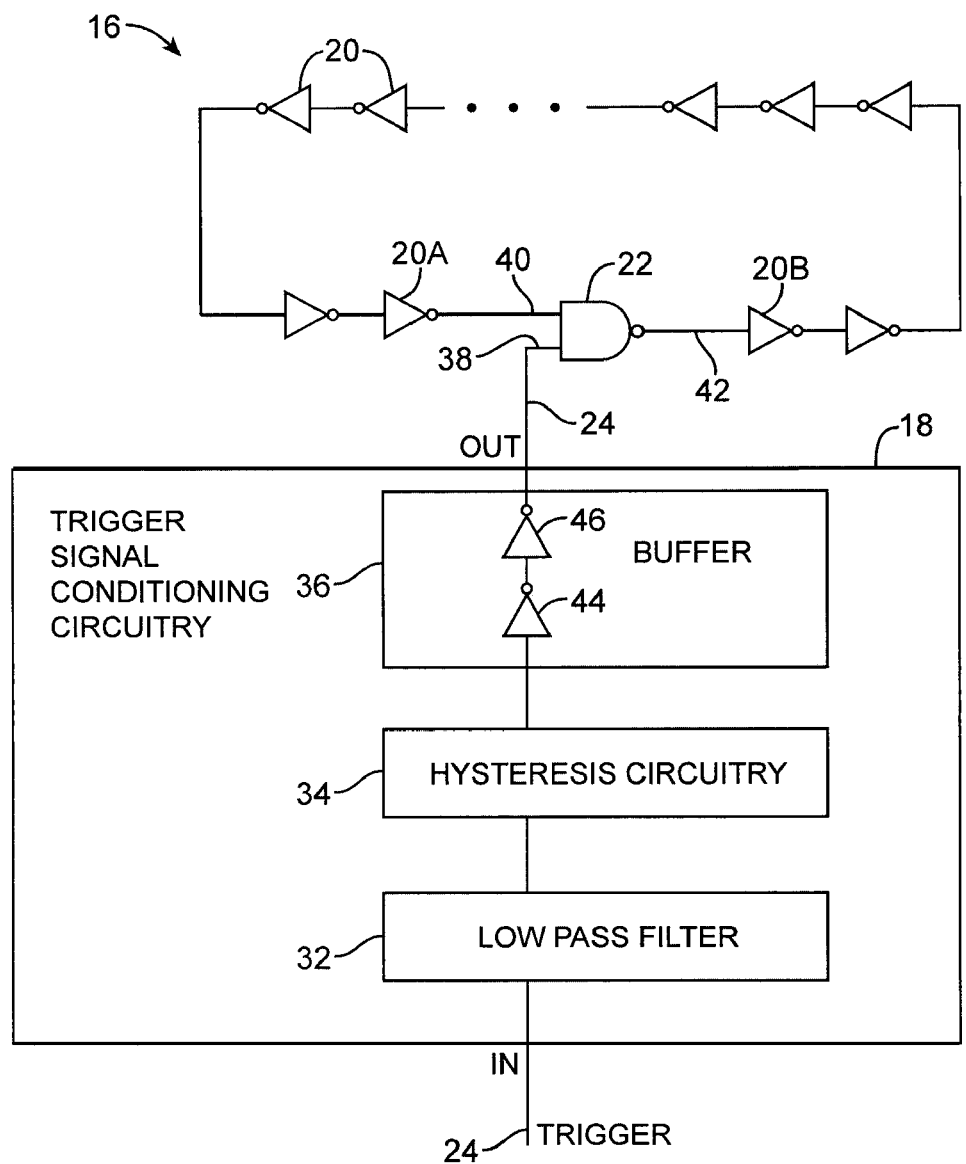
FIG. 4 is a circuit diagram of illustrative ring oscillator circuitry in accordance with an embodiment of the present invention.

Any suitable circuit components may be used in trigger signal conditioning circuitry 18 to reduce noise in the trigger signal. An illustrative configuration for trigger signal conditioning circuitry 18 is shown in FIG. 4. In the example of FIG. 4, trigger signal conditioning circuitry 18 includes low pass filter 32, hysteresis circuitry 34, and buffer circuitry 36. Circuit components such as low pass filter 32, hysteresis circuitry 34, and buffer circuitry 36 may be used in any suitable order. For example, the order of hysteresis circuitry 34 and low pass filter 32 may be reversed or buffer circuitry 36 may be placed before low pass filter 32 or before hysteresis circuitry 34. If desired, components such as buffer 36, hysteresis circuitry 34, and low pass filter 32 may be selectively omitted. For example, trigger signal conditioning circuitry 18 may include hysteresis circuitry 34 without including low pass filter 32 or trigger signal conditioning circuitry 18 may include low pass filter 32 without including hysteresis circuitry 34. Moreover, different circuit components may be used in trigger signal conditioning circuitry 18 if desired. The circuits in trigger signal conditioning circuitry 18 of FIG. 4 are merely illustrative.

As shown in FIG. 4, a trigger signal TRIGGER may be received at input IN of trigger signal conditioning circuitry 18. A corresponding conditioned version of signal TRIGGER may be provided at output OUT of trigger signal conditioning circuitry 18. The signal at output OUT may be applied to control input 38 of control logic 22. In the example of FIG. 4, control logic 22 has been implemented using a two-input NAND gate. Input 40 of NAND gate 22 receives the output from inverter 20A. Output 42 of NAND gate 22 provides an inverted version of the signal from inverter 20A to the input of inverter 20B.

In trigger signal conditioning circuitry 18 of the type shown in FIG. 4, low pass filter 32 can serve to remove high-frequency noise components from the incoming signal. For example, if the degraded trigger signal includes short noise spikes, low pass filter 32 may help reduce or remove the noise spikes from the trigger signal. Hysteresis circuitry 34 can also be used to reduce noise artifacts in the trigger signal.

Buffer 36 may be used to strengthen and stabilize the trigger signal before the trigger signal is applied to control input 38 of control logic 22. Buffer 36 may include multiple inverters or other drivers. For example, buffer 36 may be a two-stage buffer that includes first inverter 44 and second inverter 46. First inverter 44 and second inverter 46 may help to precondition the trigger signal. For optimum preconditioning, first inverter 44 and second inverter 46 may be implemented using the same design as inverters 20. For example, first inverter 44 and second inverter 46 may have n-channel and p-channel metal-oxide-semiconductor transistors that have gate lengths and widths that are the same as the gate lengths and widths of the n-channel and p-channel metal-oxide-semiconductor transistors in inverters 20. Oxide thicknesses, doping concentrations, and device geometries may also be matched. By fabricating the transistors in inverters 44 and 46 so that they match the transistors in inverters 20, the beneficial signal preconditioning properties of buffer 36 may be enhanced.

Illustrative low pass filter circuitry 32 may be formed using any suitable filtering circuitry. Illustrative examples are provided in FIGS. 5 and 6. In the illustrative arrangement of FIG. 5, low pass filter 32 has an input (INPUT) at which unfiltered trigger signals are provided and has an output (OUTPUT) at which corresponding low-pass-filtered versions of the trigger signals are provided. Filter 32 of FIG. 5 includes an inverter 48 and a capacitor 50 that is connected between node N1 and ground terminal 52. In the illustrative arrangement of FIG. 6, low pass filter 32 includes a resistor 54 and a capacitor 50 that is connected between node N1 and ground terminal 52. Resistor 54 may be, for example, a polysilicon resistor. Capacitor 50 may be, for example a capacitor structure formed from a metal-oxide-semiconductor transistor structure. If desired, capacitor 50 may be implemented using a metal-insulator-metal (MIM) capacitor structure.

Figure 5:
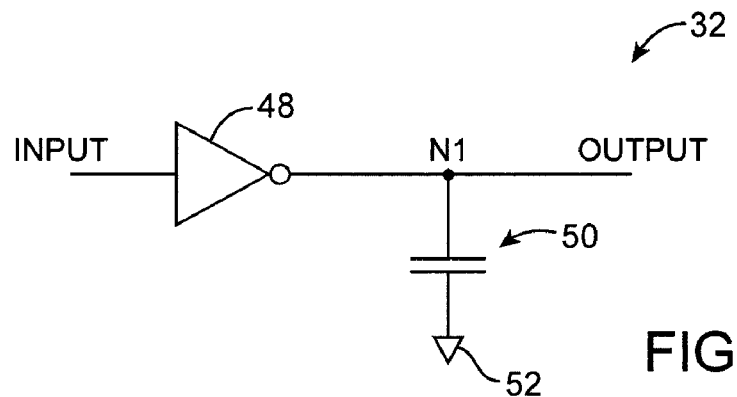
FIG. 5 is a schematic diagram of an illustrative low-pass filter formed from an inverter and a capacitor that is coupled to ground in accordance with an embodiment of the present invention.
Figure 6:
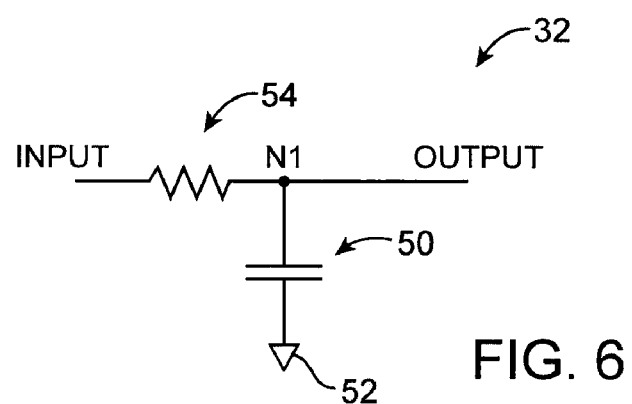
FIG. 6 is a schematic diagram of an illustrative low-pass filter formed from a resistor and a capacitor that is coupled to ground in accordance with an embodiment of the present invention.
Figure 7:
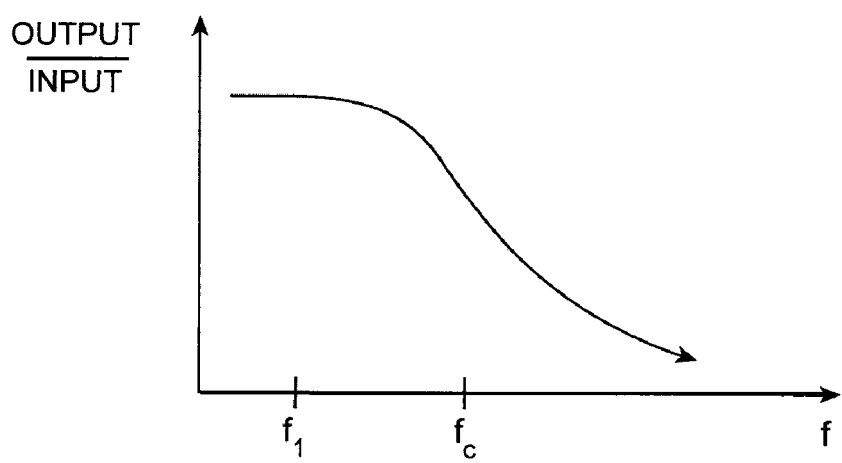
FIG. 7 is a graph showing the behavior of a low-pass filter as a function of input signal frequency in accordance with an embodiment of the present invention.

An illustrative frequency response curve for a low pass filter such as low pass filter 32 of FIGS. 5 and 6 is shown in FIG. 7. As shown in FIG. 7, input signal components which have relatively low frequencies (e.g., frequencies below cut-off frequency fc) are passed unimpeded from INPUT to OUTPUT. Signal components that have frequencies above cutoff frequency fc are attenuated. At frequencies that are significantly above fc, signals can be strongly attenuated as shown in the graph of FIG. 7. Voltage spikes that arise on a trigger signal as the trigger signal is conveyed towards control logic 22 have high-frequency components and may therefore be attenuated significantly by low pass filter 32.

Figure 8:
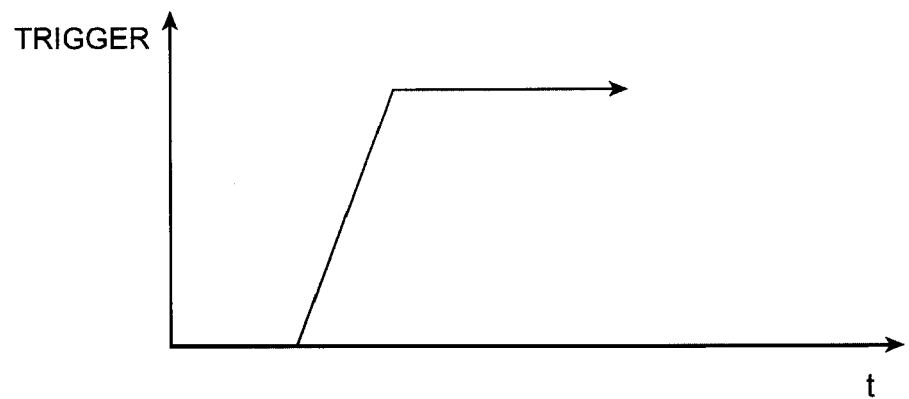
FIG. 8 is a graph of an illustrative trigger signal in accordance with an embodiment of the present invention.
Figure 9:
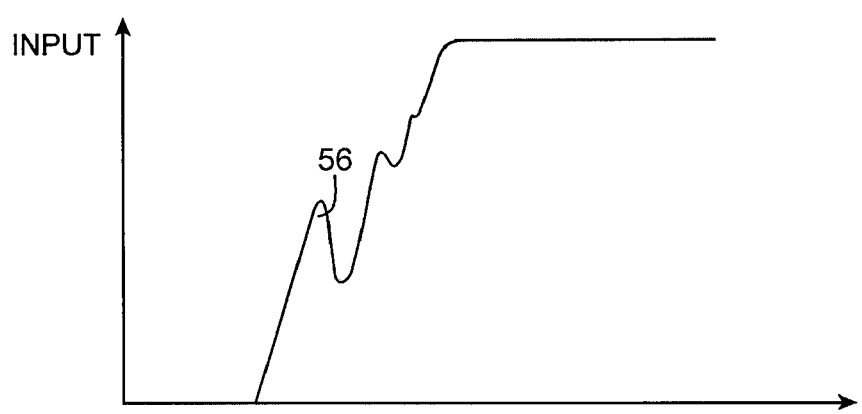
FIG. 9 is a graph of an illustrative trigger signal of the type shown in FIG. 8 after the trigger signal has been degraded on its way to the input of a ring oscillator in accordance with an embodiment of the present invention.
Figure 10:
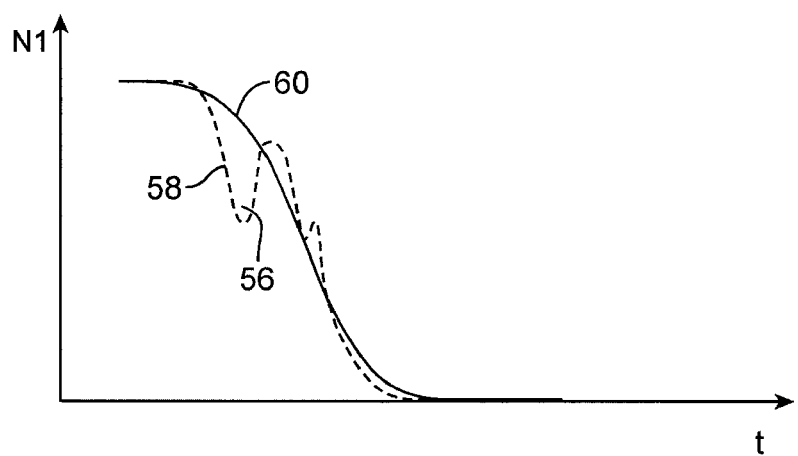
FIG. 10 is a graph showing how a degraded trigger signal of the type shown in FIG. 9 may be improved using a low-pass filter in accordance with an embodiment of the present invention.

This process is illustrated in FIGS. 8, 9, and 10. An illustrative undegraded trigger signal TRIGGER that may be used to control ring oscillator 16 is shown in FIG. 8. Signal TRIGGER may, for example, be produced by test equipment 12. As shown in FIG. 9, after traveling to the input (INPUT) of low pass filter 32, the trigger signal TRIGGER may be degraded. In particular, the trigger signal may contain noise features such as signal spike 56 of FIG. 9. After passing through low pass filter 32 to node N1, the trigger signal is inverted and the magnitude of signal spike 56 is reduced or eliminated. Dashed line 58 of FIG. 10 represents an inverted (but unfiltered) version of the degraded trigger signal of FIG. 9. Solid line 60 in FIG. 10 represents the corresponding filtered output signal OUTPUT that may appear at node N1 at the output of low pass filter 32. As demonstrated by the FIG. 10 example, noise spike 56 may be removed from the trigger signal by the low pass filter.

Figure 11:
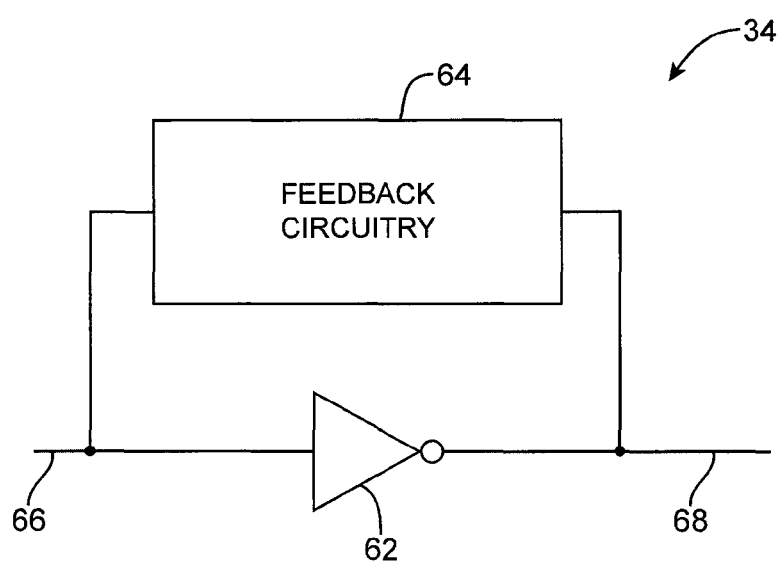
FIG. 11 is a schematic diagram of an illustrative hysteresis circuit in accordance with an embodiment of the present invention.

Illustrative hysteresis circuitry 34 is shown in FIG. 11. As shown in FIG. 11, hysteresis circuitry 34 may have an input 66 at which degraded trigger signals may be received and may have an output 68 at which a conditioned (processed) output signal may be provided. Inverter 62 receives the input signal on line 66 and provides a corresponding inverted version of this signal to line 68. Feedback circuitry 64 may be coupled between line 68 and line 66. Feedback circuitry 64 provides circuitry 34 with hysteresis, so that the point at which output 68 switches depends on the history of the signal on line 66. Because of inverter 62, the state of output 68 is generally an inverted version of input 66. However, due to the presence of feedback circuitry 64, the state of output 68 depends not only on the state of input 66, but also on the previous state of input 66. Accordingly, the input voltages that cause the output of the hysteresis circuit to exhibit a transition in voltage vary depending on whether the input voltage is rising or falling.

Figure 12:
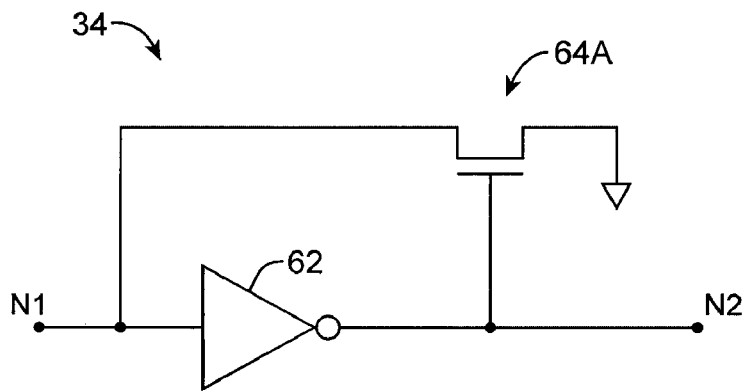
FIG. 12 is a circuit diagram of an illustrative hysteresis circuit based on an n-channel metal-oxide-semiconductor feedback transistor in accordance with an embodiment of the present invention.
Figure 13:
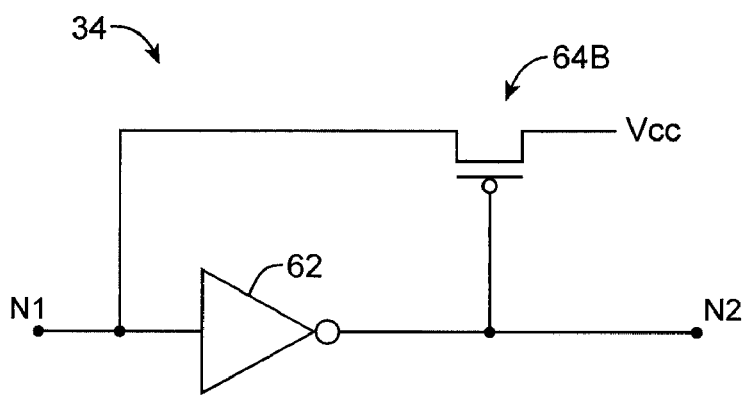
FIG. 13 is a circuit diagram of an illustrative hysteresis circuit based on a p-channel metal-oxide-semiconductor feedback transistor in accordance with an embodiment of the present invention.
Figure 14:
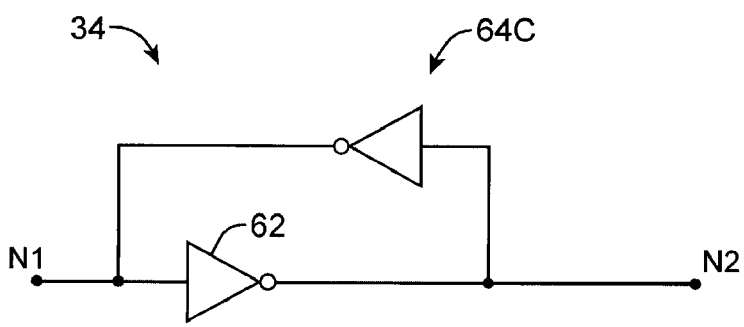
FIG. 14 is a circuit diagram of an illustrative hysteresis circuit based on a feedback inverter in accordance with an embodiment of the present invention.

Illustrative hysteresis circuits such as circuit 34 of FIG. 11 are shown in FIGS. 12, 13, and 14. In the examples of FIGS. 12, 13, and 14, the inputs of circuits 34 are labeled "N1" to indicate that the inputs of the hysteresis circuitry 34 may optionally be connected to the outputs ("N1") of low pass filters 32 such as the low pass filters 32 of FIGS. 5 and 6. The outputs of circuits 34 are labeled "N2."

In the example of FIG. 12, feedback path from node N2 to node N1 is provided by n-channel metal-oxide-semiconductor (NMOS) transistor 64A, so arrangements of the type shown in FIG. 12 are sometimes referred to as having NMOS transistor feedback arrangements.

In hysteresis circuit 34 of FIG. 13, feedback from node N2 to node N1 is provided by p-channel metal-oxide-semiconductor (PMOS) transistor 64B, so arrangements of the type shown in FIG. 13 are sometimes referred to as having PMOS transistor feedback arrangements.

Hysteresis circuit 34 of FIG. 14 has a feedback path in which an inverter 64C is coupled between node N2 and node N1. Accordingly, hysteresis circuits of the type shown in FIG. 14 are sometimes referred to as having inverter-based-feedback arrangements.

Figure 15:
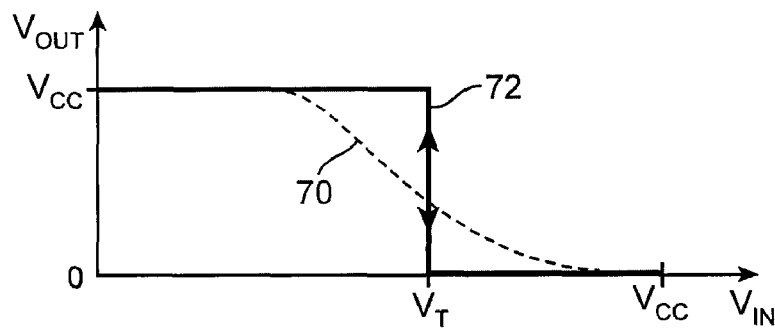
FIG. 15 is a graph showing the operation of an inverter in a circuit without hysteresis in accordance with an embodiment of the present invention.

In a conventional inverter, there is no feedback circuitry. When no feedback circuitry such as feedback circuitry 64 is used, the inverter will invert its input signal (Vin) and will produce a corresponding inverted version of the input signal at its output (Vout) without exhibiting hysteresis. The performance of this type of inverter circuit is shown in FIG. 15. (In an actual inverter, the output voltage Vout follows dashed line 70 of FIG. 15, but for clarity the transition in the output voltage Vout as a function of input voltage Vin is represented schematically by solid line 72 in FIG. 15 and is similarly represented in the other FIGS.)

As shown in FIG. 15, when input voltage Vin is low, output voltage Vout is high. When input voltage Vin is high, output voltage Vout is low. The output voltage Vout transitions from high to low when the input voltage rises above voltage Vt. The output voltage Vout also transitions from low to high when the input voltage falls below voltage Vt. Because there is no difference in the point at which the output transitions based on the direction of the input signal transition, the behavior of FIG. 15 is said not to exhibit hysteresis.

Figure 16:
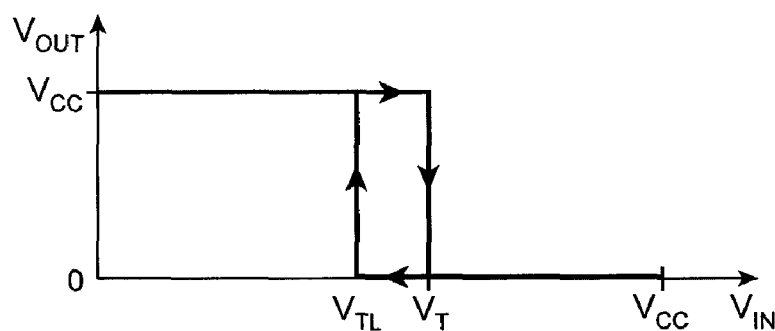
FIG. 16 is a graph showing the operation of a hysteresis circuit such as a hysteresis circuit based on an n-channel metal-oxide-semiconductor feedback transistor in accordance with an embodiment of the present invention.

In the NMOS feedback arrangement of FIG. 16, output voltage Vout transitions at Vt when input voltage Vin rises from low to high and transitions at Vtl when input voltage Vin falls from high to low.

Figure 17:
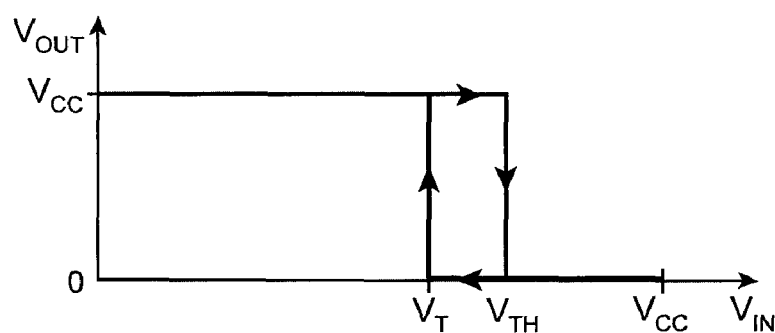
FIG. 17 is a graph showing the operation of a hysteresis circuit such as a hysteresis circuit based on a p-channel metal-oxide-semiconductor feedback transistor in accordance with an embodiment of the present invention.

In the PMOS feedback arrangement of FIG. 17, output voltage Vout transitions at Vth when input voltage Vin rises from low to high and transitions at Vt when input voltage Vin falls from high to low.

Figure 18:
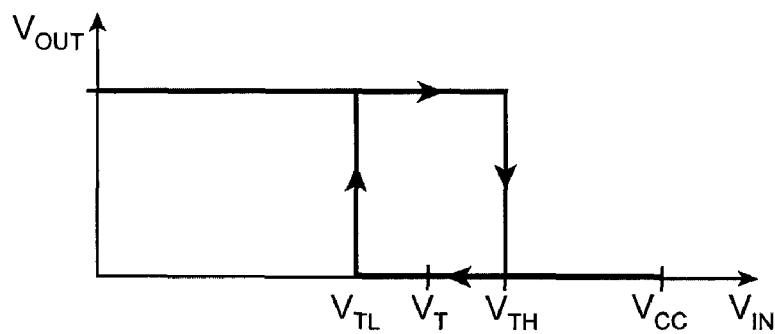
FIG. 18 is a graph showing the operation of a hysteresis circuit such as a hysteresis circuit based on a feedback inverter in accordance with an embodiment of the present invention.

In the inverter feedback arrangement of FIG. 18, output voltage Vout transitions at Vth when input voltage Vin rises from low to high and transitions at Vtl when input voltage Vin falls from high to low. The inverter that is provided in the feedback path may be, for example, an inverter formed from PMOS and NMOS transistors connected in series between a positive power supply voltage and ground.

The NMOS-type feedback, PMOS-type feedback, and inverter-type feedback arrangements may have any suitable input voltage transition thresholds (Vtl, Vt, and Vth). For example, if a logic high value in system 10 is represented by a positive power supply voltage Vcc of 1.0 volts, voltage Vt might be 0.5 volts, voltage Vtl might be 0.3 volts, and voltage Vtl might be 0.7 volts (as examples). This is, however, merely illustrative. Other suitable transition voltages may be associated with the NMOS, PMOS, and inverter-based feedback hysteresis circuits if desired. The use of these values is described herein only as an example.

In general, any suitable feedback arrangement may be used in hysteresis circuit 34 and any suitable values may be used for the transition threshold voltages. In some scenarios, the output voltages that result from a given input signal will be similar or identical. In other scenarios, hysteresis circuitry of different types may produce different results. These potential differences are illustrated in the examples of FIGS. 19-33.

Figure 19:
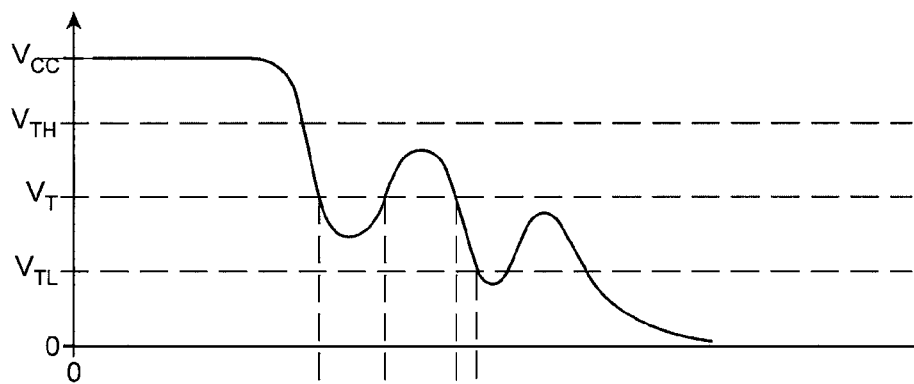
FIG. 19 is an illustrative degraded trigger signal that may be presented to the input of a hysteresis circuit in accordance with an embodiment of the present invention.

An illustrative degraded trigger signal that may be presented to the input of hysteresis circuit 34 is shown in FIG. 19.

Figure 20:
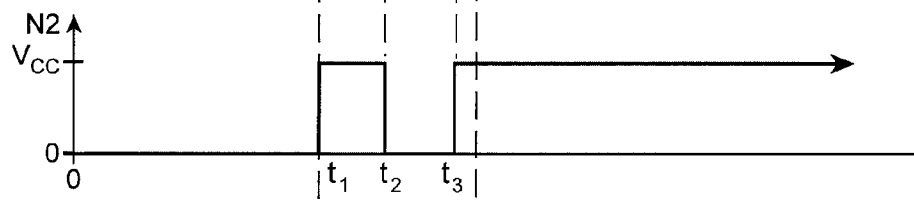
FIG. 20 is an illustrative inverter output signal that may be produced by a circuit without hysteresis when presented with a degraded trigger signal at its input such as the degraded trigger signal of FIG. 19 in accordance with an embodiment of the present invention.

FIG. 20 is an illustrative inverter output signal that may be produced by a circuit without hysteresis when processing a degraded trigger signal such as the degraded trigger signal of FIG. 19. As shown in FIG. 20, the output signal will transition up and down at times t1 and t2, before stabilizing at time t3. Because there is no hysteresis in the FIG. 20 scenario, the output of the inverter has not been smoothed by the hysteresis circuit. Accordingly, the noise that is present in the degraded trigger signal of FIG. 19 results in a noisy output signal.

Figure 21:
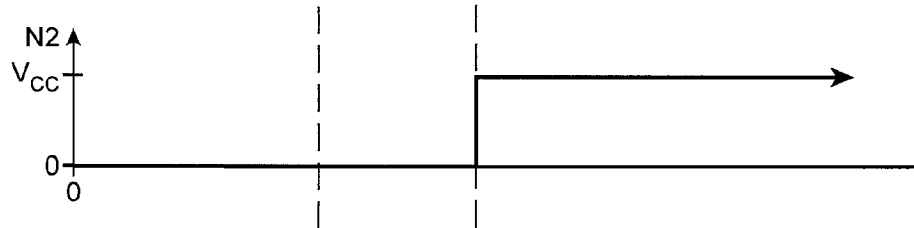
FIG. 21 is an illustrative output signal that may be produced by a hysteresis circuit having a hysteresis characteristic of the type shown in FIG. 16 when presented with a degraded trigger signal at its input such as the degraded trigger signal of FIG. 19 in accordance with an embodiment of the present invention.

FIG. 21 shows an illustrative output signal that may be produced by a hysteresis circuit 34 that has a hysteresis characteristic of the type shown in FIG. 16 when processing a degraded trigger signal such as the degraded trigger signal of FIG. 19. Because the output signal only transitions from low to high when the input signal (i.e., the voltage on node N1) falls below threshold voltage Vtl, the corresponding signal on output node N2 of the hysteresis circuit 34 is not sensitive to the noise in the degraded trigger signal. Accordingly, the node N2 voltage shown in FIG. 21 does not transition back and forth as with the signal of FIG. 20.

Figure 22:
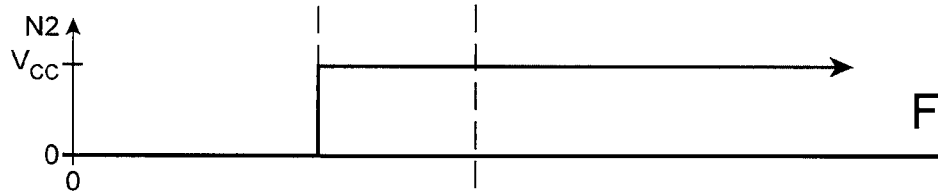
FIG. 22 is an illustrative output signal that may be produced by a hysteresis circuit having a hysteresis characteristic of the type shown in FIG. 17 when presented with a degraded trigger signal at its input such as the degraded trigger signal of FIG. 19 in accordance with an embodiment of the present invention.

FIG. 22 shows an illustrative output signal that may be produced by a hysteresis circuit 34 that has a hysteresis characteristic of the type shown in FIG. 17 when presented with the degraded trigger signal of FIG. 19 at its input. In this scenario, the signal N2 goes high once input signal N1 falls below Vt, but does not transition back and forth as with the FIG. 20 scenario, because high-to-low transitions in the output signal only occur when input signal N1 rises above Vth.

Figure 23:
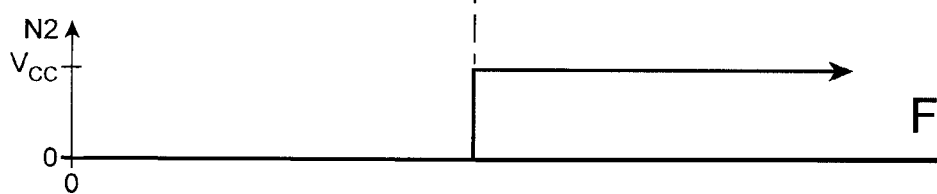
FIG. 23 is an illustrative output signal that may be produced by a hysteresis circuit having a hysteresis characteristic of the type shown in FIG. 18 when presented with a degraded trigger signal at its input such as the degraded trigger signal of FIG. 19 in accordance with an embodiment of the present invention.

FIG. 23 shows an illustrative output signal that may be produced by a hysteresis circuit 34 that has a hysteresis characteristic of the type shown in FIG. 18 when presented with the degraded trigger signal of FIG. 19. As shown in FIG. 23, output signal N2 will transition from low to high when input voltage N1 falls below threshold voltage Vtl.

In the illustrative scenario of FIGS. 19-23, all three types of hysteresis circuit 34 effectively converted the noisy degraded trigger signal on node N1 into a clean trigger signal on node N2 (unlike the hysteresis-free circuit of FIG. 20). In some situations (e.g., with particularly noisy degraded trigger signals), some of the hysteresis circuits may be more effective than others. When the degraded trigger signal exhibits large variations in voltage, it may be advantageous to use a hysteresis circuit in which there is a relatively large spread between the low and high input voltage thresholds. In the present example, the hysteresis circuit that has the inverter-based feedback arrangement has the largest threshold voltage spread (Vth to Vtl), so this hysteresis circuit is able to eliminate trigger signal noise features that would not be removed by the hysteresis circuits with the NMOS transistor feedback and PMOS transistor feedback configurations.

FIGS. 24-28 illustrate a scenario in which a hysteresis circuit with hysteresis characteristics of the type set forth in FIG. 17 (e.g., a PMOS-transistor-feedback hysteresis circuit) can fail.

Figure 24:
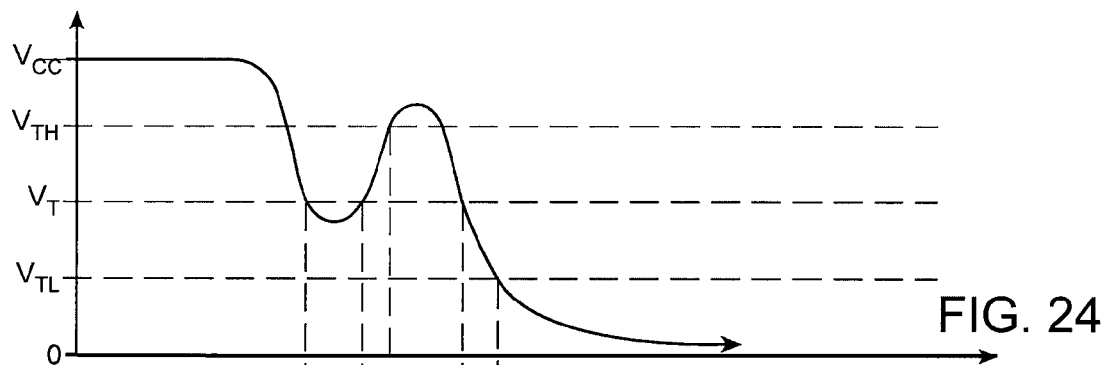
FIG. 24 is another illustrative degraded trigger signal that may be presented to the input of a hysteresis circuit in accordance with an embodiment of the present invention.

An illustrative degraded trigger signal that may be presented to the input of a hysteresis circuit in this type of scenario is shown in FIG. 24.

Figure 25:
FIG. 25 is an illustrative inverter output signal that may be produced by a circuit without hysteresis when presented with a degraded trigger signal at its input such as the degraded trigger signal of FIG. 24 in accordance with an embodiment of the present invention.

FIG. 25 shows an illustrative inverter output signal that may be produced by a circuit without hysteresis when presented with the degraded trigger signal of FIG. 24.

Figure 26:
FIG. 26 is an illustrative output signal that may be produced by a hysteresis circuit having a hysteresis characteristic of the type shown in FIG. 16 when presented with a degraded trigger signal at its input such as the degraded trigger signal of FIG. 24 in accordance with an embodiment of the present invention.

An output signal of the type that may be produced by a hysteresis circuit 34 having a hysteresis characteristic of the type shown in FIG. 16 when presented with the degraded trigger signal of FIG. 24 is shown in FIG. 26. This hysteresis circuit 34 successfully removes the noise spike shown in FIG. 24.

Figure 27:
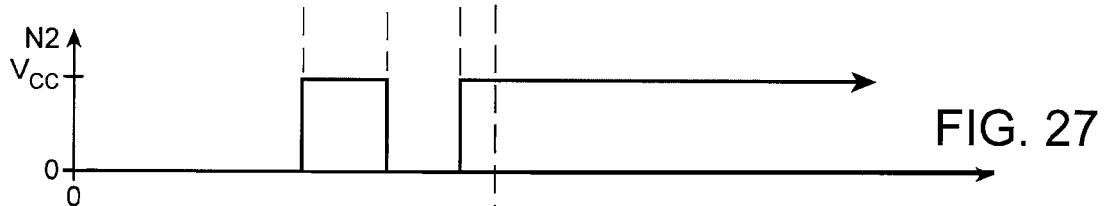
FIG. 27 is an illustrative output signal that may be produced by a hysteresis circuit having a hysteresis characteristic of the type shown in FIG. 17 when presented with a degraded trigger signal at its input such as the degraded trigger signal of FIG. 24 in accordance with an embodiment of the present invention.

FIG. 27 shows an illustrative output signal that may be produced by a hysteresis circuit that has a hysteresis characteristic of the type shown in FIG. 17 when presented with the degraded trigger signal of FIG. 24. As shown in FIG. 27, this type of hysteresis circuit was not entirely successful at removing the noise associated with the degraded trigger signal of FIG. 24.

Figure 28:
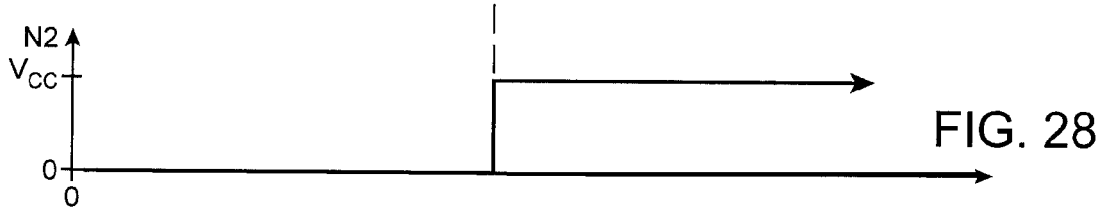
FIG. 28 is an illustrative output signal that may be produced by a hysteresis circuit having a hysteresis characteristic of the type shown in FIG. 18 when presented with a degraded trigger signal at its input such as the degraded trigger signal of FIG. 24 in accordance with an embodiment of the present invention.

FIG. 28 shows an illustrative output signal that may be produced by a hysteresis circuit 34 that has a hysteresis characteristic of the type shown in FIG. 18 when presented with a degraded trigger signal at its input such as the degraded trigger signal of FIG. 24. As with the example of FIG. 26, this hysteresis circuit 34 successfully removes the noise spike shown in FIG. 24.

FIGS. 29-33 illustrate a scenario in which a hysteresis circuit with hysteresis characteristics of the type set forth in FIG. 16 (e.g., an NMOS-transistor-feedback hysteresis circuit) can fail.

Figure 29:
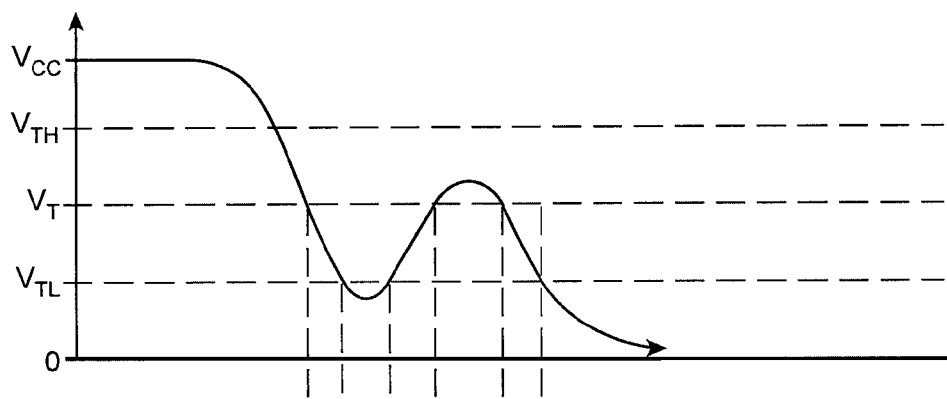
FIG. 29 is yet another illustrative degraded trigger signal that may be presented to the input of a hysteresis circuit in accordance with an embodiment of the present invention.

An illustrative degraded trigger signal is shown in FIG. 29. As shown in FIG. 29, the degraded trigger signal has a noise feature that may induce higher-order frequency oscillations to arise in ring oscillator 16 if not suppressed.

Figure 30:
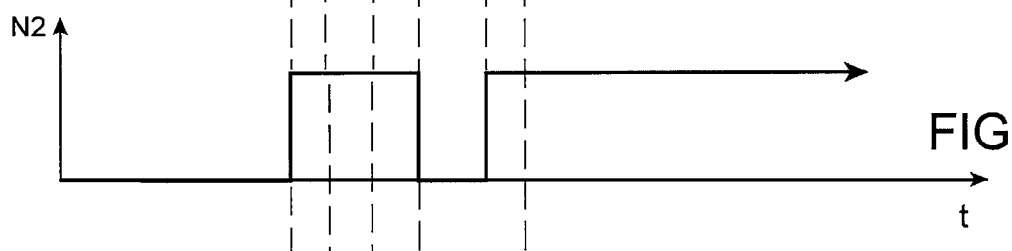
FIG. 30 is an illustrative inverter output signal that may be produced by a circuit without hysteresis when presented with a degraded trigger signal at its input such as the degraded trigger signal of FIG. 29 in accordance with an embodiment of the present invention.

FIG. 30 shows how an inverter without hysteresis would respond when processing the signal of FIG. 29. This type of circuit does not filter out the noise spike in the degraded trigger signal.

Figure 31:
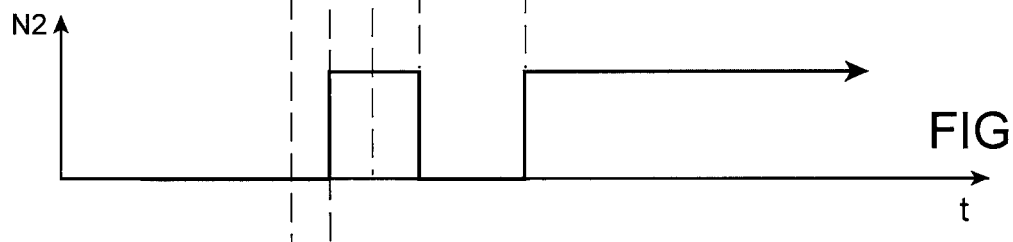
FIG. 31 is an illustrative output signal that may be produced by a hysteresis circuit having a hysteresis characteristic of the type shown in FIG. 16 when presented with a degraded trigger signal at its input such as the degraded trigger signal of FIG. 29 in accordance with an embodiment of the present invention.

FIG. 31 shows an illustrative output signal that may be produced by a hysteresis circuit 34 that has a hysteresis characteristic of the type shown in FIG. 16 when presented with the degraded trigger signal of FIG. 29. As shown in FIG. 31, this type of hysteresis circuit is not able to remove all noise features from the degraded trigger signal.

Figure 32:
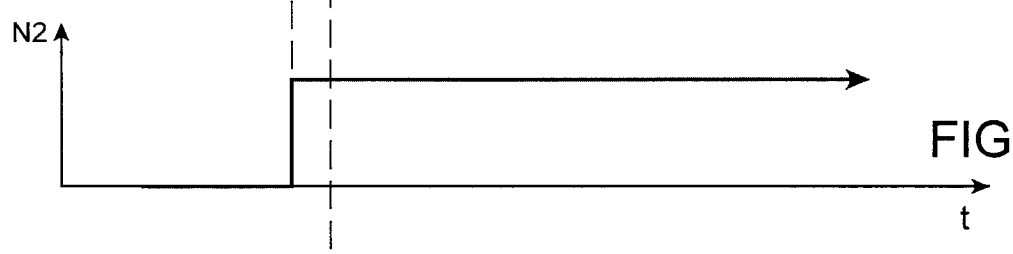
FIG. 32 is an illustrative output signal that may be produced by a hysteresis circuit having a hysteresis characteristic of the type shown in FIG. 17 when presented with a degraded trigger signal at its input such as the degraded trigger signal of FIG. 29 in accordance with an embodiment of the present invention.

FIG. 32 shows an illustrative output signal that may be produced by a hysteresis circuit 34 that has a hysteresis characteristic of the type shown in FIG. 17 when presented with a degraded trigger signal at its input such as the degraded trigger signal of FIG. 29. As shown in FIG. 32, this type of hysteresis circuit may be effective at removing noise from the degraded trigger signal.

Figure 33:
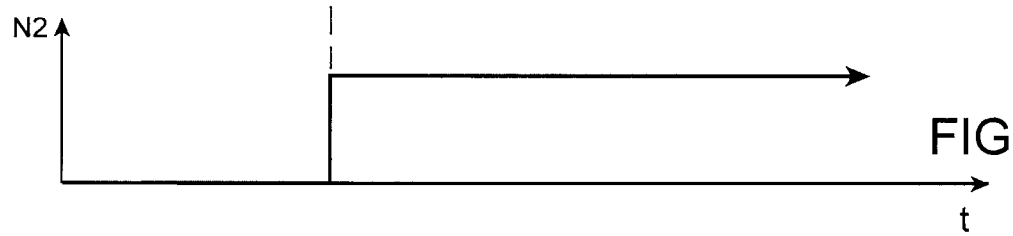
FIG. 33 is an illustrative output signal that may be produced by a hysteresis circuit having a hysteresis characteristic of the type shown in FIG. 18 when presented with a degraded trigger signal at its input such as the degraded trigger signal of FIG. 29 in accordance with an embodiment of the present invention.

FIG. 33 shows an illustrative output signal that may be produced by a hysteresis circuit 34 that has a hysteresis characteristic of the type shown in FIG. 18 when presented with a degraded trigger signal at its input such as the degraded trigger signal of FIG. 29. As with the circuit described in connection with FIG. 32, this type of hysteresis circuit may be effective at removing noise from the degraded trigger signal.

As the examples of FIGS. 19-33 demonstrate, various types of hysteresis circuit may be used to filter noise from a degraded trigger signal before that signal is used to control the control logic in a ring oscillator such as ring oscillator 16. The effectiveness of the different types of hysteresis circuits varies depending on the input voltage thresholds (Vtl, Vt, and Vth) that are associated with each hysteresis circuit. Certain circuit configurations may be better than others at removing noise features from degraded trigger signals, particularly when large amounts of noise are present. In general, however, the selection of which type of feedback circuit is to be used in a given hysteresis circuit and the values for the input voltage threshold voltages should be chosen to accommodate the amount of noise filtering that is expected for a given application. When it is expected that the trigger signal will pick up significant amounts of noise, it may be advantageous to use a hysteresis circuit with a relatively wide range of input voltage threshold values.

Figure 34:
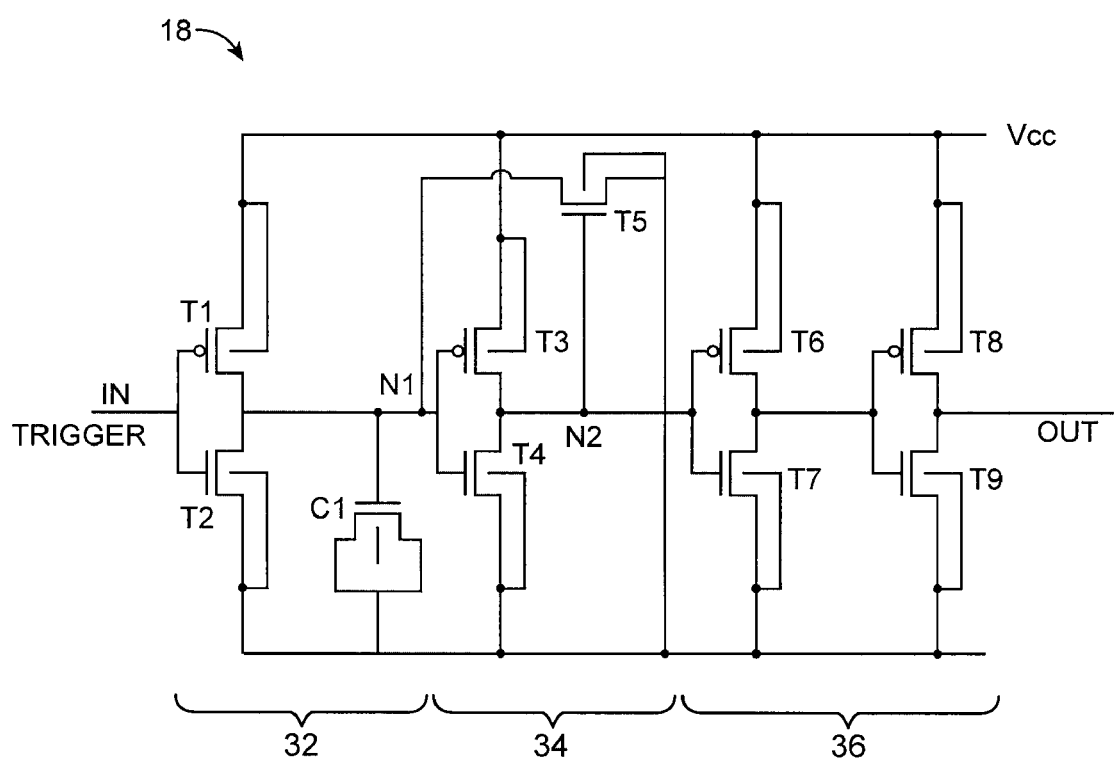
FIG. 34 is an illustrative circuit diagram of ring oscillator trigger signal conditioning circuitry in accordance with an embodiment of the present invention.

An illustrative circuit arrangement that may be used for implementing trigger signal conditioning circuit 18 is shown in FIG. 34. As shown in FIG. 34, low pass filter 32 may be implemented using an inverter formed from transistors T1 and T2 and using a capacitor C1. Capacitor C1 may be formed from an MIM capacitor structure or (as shown in FIG. 34) may be formed from a metal-oxide-semiconductor (MOS) transistor structure.

Hysteresis circuit 34 in the FIG. 34 embodiment has an inverter formed from transistors T3 and T4 and has an NMOS feedback transistor T5 that provides feedback from output node N2 to input node N1.

Transistors T6 and T7 may form a first inverter. Transistors T8 and T9 may form a second inverter. The first and second inverters may be used to form two-stage buffer 36.

The foregoing is merely illustrative of the principles of this invention and various modifications can be made by those skilled in the art without departing from the scope and spirit of the invention.

What is claimed is:

1. A ring oscillator circuit comprising:
   a plurality of inverters connected in a loop;
   control logic that is interposed in the loop and that has a first input that receives a signal that has passed through the inverters; and
   a trigger signal conditioning circuit having a hysteresis circuit and a low pass filter, wherein the trigger signal conditioning circuit removes noise from a degraded trigger signal to produce a conditioned trigger signal for the control logic and wherein the control logic has a second input that receives the conditioned trigger signal.

2. The ring oscillator circuit defined in claim 1 wherein the hysteresis circuit includes a feedback path and wherein the feedback path includes at least one n-channel metal-oxide-semiconductor transistor.

3. The ring oscillator circuit defined in claim 1 wherein the hysteresis circuit includes a feedback path and wherein the feedback path includes at least one p-channel metal-oxide-semiconductor transistor.

4. The ring oscillator circuit defined in claim 1 wherein the hysteresis circuit includes a feedback path and wherein the feedback path includes at least one inverter that includes multiple transistors.

5. The ring oscillator circuit defined in claim 1 wherein the trigger signal conditioning circuit further comprises a two-stage buffer having an output that is connected to the second input.

6. The ring oscillator circuit defined in claim 1, wherein the trigger signal conditioning circuit has an input at which the degraded trigger signal is received, wherein the low pass filter is connected between the input of the trigger signal conditioning circuit and the hysteresis circuit, and wherein the trigger signal conditioning circuit further comprises:
   a two-stage buffer having an output that is connected to the second input.

7. The ring oscillator circuit defined in claim 1, wherein the trigger signal conditioning circuit has an input at which the degraded trigger signal is received, wherein the low pass filter is connected between the input of the trigger signal conditioning circuit and the hysteresis circuit, and wherein the trigger signal conditioning circuit further comprises:
   a two-stage buffer having an output that is connected to the second input, wherein the inverters in the ring oscillator have transistors with a given gate length and width and wherein the two-stage buffer has transistors with the same given gate length and width.

8. A ring oscillator circuit comprising:
   a plurality of inverters connected in a loop;
   control logic that is interposed in the loop and that has a first input that receives a signal that has passed through the inverters;

a trigger signal conditioning circuit having a low pass filter, wherein the trigger signal conditioning circuit removes noise from a degraded trigger signal to produce a conditioned trigger signal for the control logic and wherein the control logic has a second input that receives the conditioned trigger signal; and a hysteresis circuit connected in series with the low pass filter.

9. The ring oscillator circuit defined in claim 8 wherein the low pass filter includes a capacitor that is connected to ground.

10. The ring oscillator circuit defined in claim 8, wherein the hysteresis circuit includes a feedback path and wherein the feedback path includes at least one n-channel metal-oxide-semiconductor transistor.

11. The ring oscillator circuit defined in claim 8, wherein the hysteresis circuit includes a feedback path and wherein the feedback path includes at least one p-channel metal-oxide-semiconductor transistor.

12. The ring oscillator circuit defined in claim 8, wherein the hysteresis circuit includes a feedback path and wherein the feedback path includes at least one inverter that includes multiple transistors.

13. The ring oscillator circuit defined in claim 8, wherein the trigger signal conditioning circuit comprises a two-stage buffer that is connected in series with the low pass filter and the hysteresis circuit and that has an output that is connected to the second input.

14. The ring oscillator circuit defined in claim 8, wherein the control logic comprises a NAND gate, wherein the first input is connected to an inverter output in the loop, and wherein the control logic has an output connected to an inverter input in the loop.

15. A method of conditioning ring oscillator trigger signals, comprising:

receiving a degraded ring oscillator trigger signal from off-chip equipment;

low pass filtering the degraded ring oscillator trigger signal from the off-chip equipment to produce a corresponding conditioned trigger signal;

applying the conditioned trigger signal to an enable input associated with a ring oscillator;

removing noise from the degraded ring oscillator trigger signal using a hysteresis circuit having a feedback path; and passing the conditioned trigger signal through a two-stage buffer before applying the conditioned trigger signal to the enable input associated with the ring oscillator.

16. A method of conditioning ring oscillator trigger signals, comprising:

receiving a degraded ring oscillator trigger signal from off-chip equipment;

low pass filtering the degraded ring oscillator trigger signal from the off-chip equipment to produce a corresponding conditioned trigger signal; and applying the conditioned trigger signal to an enable input associated with a ring oscillator;

removing noise from the degraded ring oscillator trigger signal using a hysteresis circuit having a feedback path, wherein the hysteresis circuit includes an inverter that receives signals from a low pass filter and has associated first and second input voltage threshold voltages at which the output of the inverter transitions in response to input voltage transitions and wherein removing noise from the degraded ring oscillator trigger signal comprises:

switching the output of the hysteresis circuit from low to high when an input to the hysteresis circuit falls from high to low past the first input voltage threshold; and switching the output of the hysteresis circuit from high to low when the input to the hysteresis circuit rises from low to high past the second input voltage threshold, wherein the first and second input voltage thresholds are different.

17. A ring oscillator circuit comprising:

a plurality of inverters connected in a loop;

control logic that is interposed in the loop and that has a first input that receives a signal that has passed through the inverters; and a trigger signal conditioning circuit having a hysteresis circuit with an input, wherein the trigger signal conditioning circuit removes noise from a degraded trigger signal to produce a conditioned trigger signal for the control logic, wherein the control logic has a second input that receives the conditioned trigger signal, and wherein the hysteresis circuit exhibits a first output voltage transition for rising signals at its input and a second output voltage transition that is lower than the first output voltage transition for falling signals at its input.

18. The ring oscillator circuit defined in claim 17, wherein the hysteresis circuit includes a feedback path and wherein the feedback path includes at least one inverter that includes multiple transistors.

19. The ring oscillator circuit defined in claim 17, wherein the trigger signal conditioning circuit further comprises a low pass filter that removes noise from the degraded trigger signal.

20. The ring oscillator circuit defined in claim 17, wherein the trigger signal conditioning circuit further comprises a two-stage buffer having an output that is connected to the second input.

* * * * *